United States Patent [19]

Pitetti et al.

[11] 4,374,159

[45] Feb. 15, 1983

[54] FABRICATION OF FILM CIRCUITS HAVING A THICK FILM CROSSUNDER AND A THIN FILM CAPACITOR

[75] Inventors: Raymond C. Pitetti, Wescosville; John Rutkiewicz, Center Valley, both of Pa.

[73] Assignee: Bell Telephone Laboratories, Incorporated, Murray Hill, N.J.

[21] Appl. No.: 287,418

[22] Filed: Jul. 27, 1981

[51] Int. Cl.³ .............................................. H05K 3/12
[52] U.S. Cl. ...................................... 427/96; 156/664; 204/192 SP; 427/99; 427/101; 427/79; 427/80; 501/20
[58] Field of Search ...................... 427/80, 96, 101, 79, 427/99; 156/664; 204/192 SP; 501/20

[56] References Cited

U.S. PATENT DOCUMENTS

| | | | |
|---|---|---|---|
| 3,317,653 | 5/1967 | Layer, Jr. et al. | 174/68.5 |
| 3,560,256 | 2/1971 | Abrams | 427/99 |
| 3,607,679 | 9/1971 | Melroy | 204/15 |
| 4,031,272 | 6/1977 | Khanna | 427/96 |
| 4,241,103 | 12/1980 | Ohkubo et al. | 427/103 |
| 4,251,326 | 2/1981 | Arcidiacono et al. | 204/15 |

OTHER PUBLICATIONS

Abe et al., "Development of the Thick-Film Capacitor and Its Application for Hybrid Circuit Modules," IEEE Transactions on Components, Hybrids, and Manufacturing Tech., vol. CHMT-2, No. 4, Dec. 1979.

Primary Examiner—John D. Smith
Attorney, Agent, or Firm—Lester H. Birnbaum

[57] ABSTRACT

A method of fabricating film circuits whereby thick film crossunders may be included with thin film capacitors (22) on a single substrate (10). At least one dielectric layer (12) is formed on the crossunder electrode (11) and a layer capable of smoothing irregularities (13) is also formed in the area of capacitor formation. Firing of the capacitor underlayer is compatible with the dielectric layer. A layer such as beta tantalum (14) is formed over essentially the entire circuit and etched from the contact areas (21) of the crossunder electrode. The layer is oxidized to form a protective layer (15) for the previously deposited layers as well as an underlay for subsequently formed thin film components.

13 Claims, 6 Drawing Figures

FABRICATION OF FILM CIRCUITS HAVING A THICK FILM CROSSUNDER AND A THIN FILM CAPACITOR

BACKGROUND OF THE INVENTION

This invention relates to film circuits and in particular to a method of fabricating such circuits which permits thick film crossunders and thin film capacitors to be formed on the same substrate.

Thin film circuits offer significant advantages over most thick film and silicon integrated circuits where precision components are needed. In fabricating thin film circuits, just as in the integrated circuit field, a great deal of effort and attention has been directed to packing more components onto a substrate. This trend has necessitated use of some type of structure for bridging conductors when high density circuits are desired. Although several alternatives are available for this function, the most reliable appears to be the thick film crossunder. As known in the art of thin film circuit fabrication, such structures are typically formed by depositing a thick film electrode such as gold coupled to the thin film conductors to be bridged. One or more layers of a thick film dielectric such as glass layers are then deposited and fired and a thin film conductor formed thereover in a direction essentially orthogonal to the conductor being bridged.

While thick film crossunders have been used for thin film resistor circuits, it does not appear that they have been successfully incorporated into circuits including thin film capacitors. Among other reasons, this was apparently due to the incompatibility of firing cycles for the crossunder dielectrics and thick film electrodes with the standard capacitor components, especially the glass layer used for compensation of the roughness of the circuit substrate underlying the capacitor and the oxide underlay used to protect the glass layer.

It is therefore an object of the invention to provide a technique for the fabrication of film circuits which permits fabrication of thick film crossunders with thin film capacitors on the same substrate. It is a further object of the invention to provide a technique for incorporating thin and thick film components on a single substrate with a minimum number of processing steps.

SUMMARY OF THE INVENTION

These and other objects are achieved in accordance with the invention which is a method of fabricating a film circuit on an insulating substrate. A thick film electrode is formed on one portion of the substrate. A plurality of dielectric layers are deposited and fired on a portion of the electrode, and at least one layer capable of smoothing irregularities on the substrate is deposited and fired on a portion of the substrate remote from the electrode where a capacitor is to be formed. The firing of all layers is compatible with previously deposited and fired layers. A metal layer is then deposited over essentially the entire substrate and a portion of the metal is removed from the area of the thick film electrode to be contacted. The metal layer is oxidized to form a protective oxide layer. This is followed by fabricating over the oxide at least one thin film capacitor and a thin film conductor electrically coupled to the thick film electrode.

BRIEF DESCRIPTION OF THE DRAWING

These and other features of the invention will be delineated in detail in the following description. In the drawing.

It will be appreciated that for purpose of illustration, these figures are not necessarily drawn to scale.

DETAILED DESCRIPTION

One embodiment of the invention will be described with reference to the sequence of steps illustrated in FIGS. 1-6. It will be appreciated that these figures show only one portion of a film circuit which would usually include many more elements, including one or more integrated circuit chips bonded to the substrate to form a hybrid integrated circuit.

Figure 1:
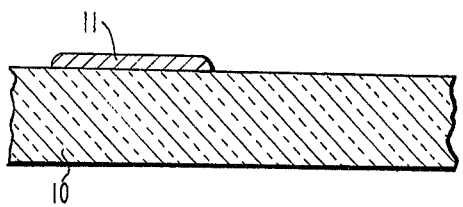
FIGS. 1-6 are cross-sectional views of a portion of a film circuit during various stages of fabrication in accordance with one embodiment of the invention.

As illustrated in FIG. 1, the circuit was formed on one surface of an insulating substrate, 10, which in this case is alumina. Any type of substrate compatible with film circuit fabrication may be utilized with the present invention. Deposited on a selected portion of the surface of the substrate by standard screen printing techniques was a thick film electrode, 11. In this particular example, the electrode was deposited as a paste comprising fritted gold and then fired at a temperature of 975 degrees Celsius for 10 minutes to achieve the desired conductivity. Typically, the electrode will be fired at a temperature in the range 900-1000 degrees Celsius for 10-20 minutes to achieve a conductivity on the range 0.002-0.010 $\Omega/\square$. Other standard thick film compositions could be used. The thickness of the electrode was approximately 1 mil and the thickness will usually lie within the range 0.5-1.5 mils.

Figure 2:
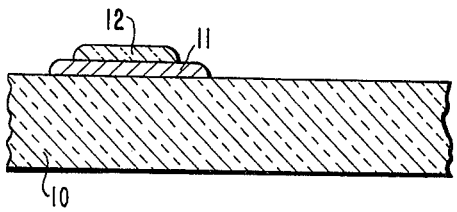

As illustrated in FIG. 2, a first dielectric layer, 12, was then deposited by standard screen printing on a portion of the electrode. In this example the layer was deposited from a paste comprising glass powders dispersed in an organic vehicle where the powders comprise the oxides of silicon, lead, calcium, aluminum, boron, potassium, magnesium and sodium, and the organic vehicle comprises cellulose based polymers dissolved in a solvent system based on pine oil derivatives and a mixed ester. Such a paste is sold, for example, by DuPont under the designation 9615. The glass powders comprised approximately 70 percent by weight of the paste. After deposition, the paste was fired at a temperature of approximately 875 degrees Celsius for approximately 10 minutes. In general, a temperature in the range 800-950 degrees Celsius for a time within the range 10-20 minutes would be used to produce the appropriate adhesion and mechanical strength for the crossunder. The thickness of the layer 12 was approximately 0.5 mil, though thicknesses in the range 0.4-1.0 mils will generally be preferred.

It will be appreciated that although a particular preferred composition of layer 12 is disclosed, the invention could be used with other dielectric layers which are capable of electrically insulating the crossunder and crossover conductors, can withstand subsequent thin film processing, and have a thermal expansion coefficient which is compatible with the other deposited layers.

Figure 3:
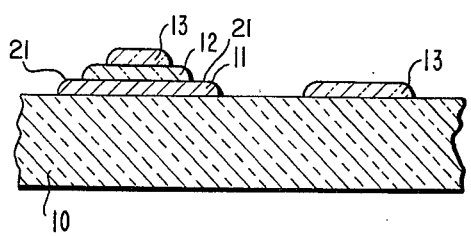

As noted in FIG. 3, a second dielectric layer, 13, was deposited, again by standard screen-printing, over the first layer 12 and also in selected portions of the substrate remote from the thick film electrode (only one of which is shown). The latter portions are the areas chosen for fabrication of thin film capacitors described later. Thus, in this embodiment, the second layer serves the dual function of serving as the dielectric protection for the thick film electrode and also compensating for irregularities in the substrate to permit capacitor fabrication. Typically, in prior art processes, such functions were performed by different compositions.

In this particular example, the layer 13 was deposited from a paste which, again, comprised glass powders dispersed in an organic vehicle. For this layer, however, the glass powders comprised oxides of silicon, boron, calcium, barium, aluminum, lead, bismuth, titanium and potassium. The organic vehicle comprised cellulose based polymers dissolved in alpha terpineol. The glass powders comprised approximately 30–35 percent by weight of the paste.

The firing of the second layer, 13, must be chosen so as to be compatible with the previously deposited layer, 12. That is, the firing must be sufficient to achieve the appropriate adhesion and mechanical strength for the second layer without melting the first layer. In this particular example, the firing of the first layer actually increases its melting point from 850 to 950 degrees Celsius. Thus, the second layer was fired at a temperature of approximately 950 degrees Celsius for a time of 10 minutes. Firing in the range 850–975 degrees Celsius for 10–20 minutes will generally be useful. The thickness of the layer, 13, was approximately 0.5 mils, but will generally lie within the range 0.3–1.0 mil. Again, other compositions may be suitable.

The previous step has the advantage of combining deposition of the top crossunder glass layer and the underlying capacitor glass layer. Alternatively, the two layers could comprise different compositions and be deposited and fired separately. In such a case the firing of each layer must be compatible with all the previously deposited layers. In a typical sequence, after deposition and firing of layer 12, the top dielectric for the crossunder would be deposited and fired, followed by deposition and firing of another glass layer in the area of capacitor formation. The top dielectric would typically be the same as the bottom dielectric (12), and the capacitor underlayer (13) would be the composition previously described for both the top dielectric and capacitor underlayer. The bottom layer would typically be fired at 800–875 degrees Celsius for 10–20 minutes, and the top layer at a temperature of 800–850 degrees Celsius for 10–20 minutes. The capacitor underlayer would typically be fired at 850–950 degrees Celsius for 10–20 minutes.

It will be appreciated that the crossunder dielectric layers are deposited so as to leave two edge portions, 21, of the bottom electrode uncovered for later electrical contact. In the direction perpendicular to the plane of the figures, the glass layers can extend over the edges of the bottom electrode.

Figure 4:
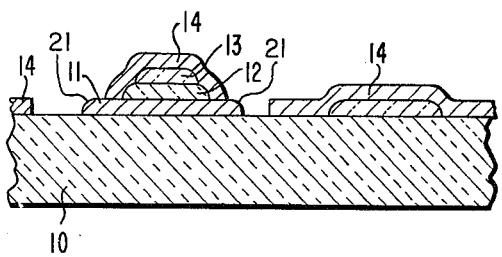

Formation of the crossunder dielectric layers and capacitor underlayers was followed by deposition over essentially the entire circuit of a layer of oxidizable metal such as beta-tantalum (14 of FIG. 4). This layer was deposited by sputtering, but any standard deposition method could be employed. The layer was approximately 500 Angstroms thick, but could have a thickness of 200–600 Angstroms in order to serve its function as a protective layer for the glass layers (12+13). Next, as shown in FIG. 4, the metal layer, 14, was etched so as to uncover the edge portions, 21, of the bottom electrode for later electrical contact. This was accomplished by photolithographic etching employing a standard photoresist (not shown) as a mask. Care must be taken, however, in etching the layer 14 without also attacking the thick film electrode (11). It was discovered that an etchant comprising hydrofluoric acid, nitric acid and water in equal proportions by volume would satisfy this condition. Other etchants which could be used in the inventive method may also be identified.

Figure 5:
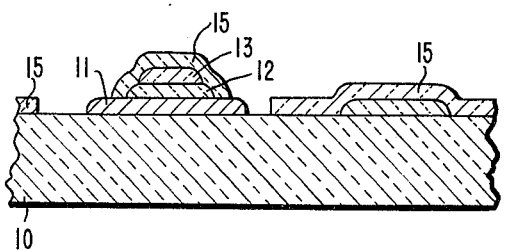
Figure 6:
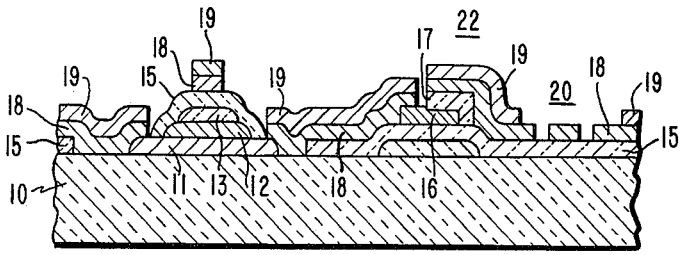

Next, the layer 14 was oxidized to completely convert the tantalum metal to $Ta_2O_5$ layer as shown in FIG. 5. This was accomplished by heating at 550 degrees Celsius for approximately 16 hours in air. The oxide layer in this example was approximately 500 Angstroms thick and should preferably be within the 200–600 Angstroms in order to adequately protect the underlying glass layers 12 and 13 during subsequent processing. It will be appreciated that other metal oxide layers could be used, but tantalum oxide is preferred since it is chemically resistant and has a thermal expansion similar to subsequently formed layers.

With the formation of the above-described dielectric layers and capacitor underlayers, the circuit can then be processed in accordance with standard thin film fabrication techniques in order to produce thin film resistors and capacitors interconnected with the thick film crossunder connection. The sequence used in this particular example will be described only briefly with reference to the final structure shown in FIG. 6, since the techniques employed are previously known and the invention is not limited to use of a particular thin film processing. (See, for example, U.S. Pat. No. 3,607,679 issued to Melroy et al., and U.S. patent application of F. R. Arcidiacono et al., Ser. No. 974,162 filed Dec. 28, 1978 and assigned to Western Electric.)

A film of alpha tantalum was deposited to a thickness of approximately 3000 Angstroms and then selectively etched to form the capacitor bottom electrode 16 in the areas of the glass layer 13 remote from the thick film electrode. The etchant was a mixture of 5:1:1 by volume of HF, $HNO_3$ and $H_2O$. A portion of the capacitor electrode was then anodized to form the capacitor dielectric, 17, comprising tantalum pentoxide. This was followed by sputtering a layer of tantalum nitride, 18, to a thickness of approximately 200 Angstroms over essentially the entire substrate. The thin film conductor, 19, was then formed over selected portions of the circuit including the exposed portions, 21, of the thick film electrode, the dual dielectric layers 12 and 13, and the capacitor dielectric, 17, to form, respectively, the thick film crossunder connection, the conductor crossover, and the top electrode of the capacitor, as well as various interconnections between components. The conductor in this case was formed by successively evaporating a layer of titanium to a thickness of 2500 Angstroms and a layer of palladium to a thickness of 2500 Angstroms, followed by selective plating of gold in the desired conductive pattern to a thickness of approximately 20,000 Angstroms. The areas of palladium left uncovered were then etched with a solution comprising ferric chloride and the titanium was etched with a solution comprising 1:1:20 by volume of HF, $HNO_3$ and $H_2O$. The uncovered tantalum nitride layer, 18, was then etched to complete conductor formation and also form the pattern for the thin film resistor, 20. The etchant was, again, a 1:1:1 by volume solution of HF, $HNO_3$ and $H_2O$.

The combination of thin film components and thick film crossunder in accordance with the invention permits very high density circuits. For example, in a typical circuit a substrate measuring 0.550 inches×2.00 inches contained 60 thin film resistors, 15 thin film capacitors and 7 silicon integrated circuit chips.

Various modifications will become apparent to those skilled in the art. All such variations which basically rely on the teachings through which the invention has advanced the art are properly considered within the spirit and scope of the invention.

What is claimed is:

1. A method of fabricating a film circuit on an insulating substrate (10) comprising the steps of:
    forming a thick film electrode (11) on one portion of said substrate;
    depositing and firing at least one dielectric layer (12) on a portion of said electrode and depositing and firing at least one layer capable of smoothing irregularities of the substrate on a portion of the substrate remote from said electrode where a capacitor (22) is to be formed, the firing of each such layer being such as not to melt a previously deposited layer;
    subsequent to formation of said layers forming a first metal layer (14) over essentially the entire substrate including said layers and said thick film electrode;
    removing a portion of said metal layer from an area (21) of the thick film electrode to accommodate an electrical contact thereto;
    oxidizing the metal layer to form a protective oxide layer (15); and
    forming over said oxide layer at least one thin film capacitor (22), and a thin film conductor (19) electrically coupled to the thick film electrode.

2. The method according to claim 1 wherein there is deposited a plurality of dielectric layers on the thick film electrode, and the layer smoothing irregularities of the substrate is the same composition as the top dielectric layer on the thick film electrode and said layers are deposited and fired simultaneously.

3. The method according to claim 2 wherein the plurality of dielectric layers (12+13) and the layer smoothing irregularities of the substrate (13) are deposited from a paste comprising glass powders dispersed in an organic vehicle.

4. The method according to claim 2 wherein the bottom dielectric layer (12) on the thick film electrode is deposited from a paste comprising glass powders comprising oxides of silicon, lead, calcium, aluminum, boron, potassium, magnesium and sodium dispersed in an organic vehicle comprising cellulose based ppolymers dissolved in a solvent system of pine oil derivatives and a mixed ester, and the top dielectric layer and the layer smoothing irregularities (13) are deposited from a paste comprising glass powders comprising the oxides of silicon, boron, calcium, barium, aluminum, lead, bismuth, titanium, and potassium dispersed in an organic vehicle comprising cellulose based polymers dissolved in alpha terpineol.

5. The method according to claim 4 wherein the bottom dielectric layer is fired at a temperature in the range 800–950 degrees Celsius for 10–20 minutes, and the top dielectric layer and the layer smoothing irregularities are fired at a temperature in the range 850–975 degrees Celsius for 10–20 minutes.

6. The method according to claim 1 wherein there is deposited a plurality of dielectric layers on the thick film electrode and the bottom dielectric layer (12) is fired at a temperature in the range 800–875 degrees Celsius for a time of 10–20 minutes, the top dielectric layer (13) is fired at a temperature in the range 800–850 degrees Celsius for 10–20 minutes, and the layer smoothing irregularities is fired at a temperature in the range 850–950 degrees Celsius for 10–20 minutes.

7. The method according to claim 1 wherein the thick film electrode is deposited from a paste comprising fritted gold.

8. The method according to claim 1 wherein the first metal layer comprises tantalum.

9. The method according to claim 8 wherein the portion of the metal layer is removed by an etchant comprising HF, $HNO_3$ and $H_2O$.

10. The method according to claim 1 wherein the firing of the dielectric layer increases the melting point of the layer as deposited and the firing of the layer smoothing irregularities is done at a temperature above the melting point of the dielectric layer as deposited.

11. A method of fabricating a film circuit on a ceramic substrate (10) comprising the steps of:
    depositing a thick film electrode (11) comprising gold on one portion of said substrate;
    depositing on a portion of said electrode a first glass layer (12) and firing at a temperature in the range 800–950 degrees Celsius for 10–20 minutes;
    depositing over said first layer and also on a portion of the substrate remote from said electrode where a capacitor is to be formed a second glass layer (13) which is also capable of smoothing irregularities of the substrate, and firing at a temperature within the range 850–975 degrees Celsius for 10–20 minutes such that firing the second layer does not melt the first layer;
    subsequent to formation of said layers, forming a first metal layer comprising tantalum over essentially the entire substrate including said layers and said thick film electrode;
    removing a portion of said metal layer from an area (21) of the thick film electrode to accommodate an electrical contact thereto utilizing an etchant comprising HF, $HNO_3$ and $H_2O$;
    oxidizing the metal layer to form a protective oxide layer (15); and
    forming over said oxide layer at least one thin film capacitor (22), thin film resistor (20) and thin film conductor (19) electrically coupled to the thick film electrode.

12. The method according to claim 11 wherein the first glass layer is deposited from a paste comprising glass powders comprising oxides of silicon, lead, calcium, aluminum, boron, potassium, magnesium and sodium dispersed in an organic vehicle comprising cellulose based polymers dissolved in a solvent system of pine oil derivatives and a mixed ester and the second glass protective layer is deposited from a paste comprising glass powders comprising the oxides of silicon, boron, calcium, barium, aluminum, lead, bismuth, titanium, and potassium dispersed in an organic vehicle comprising cellulose based polymers dissolved in alpha terpineol.

13. The method according to claim 11 wherein the firing of the first glass layer increases the melting point of the layer as deposited, and the firing of the second glass layer is done at a temperature above the melting point of the first glass layer as deposited.

* * * * *